(12) United States Patent
Wu

(10) Patent No.: US 12,277,988 B2
(45) Date of Patent: Apr. 15, 2025

(54) DATA PROCESSING METHOD, DATA PROCESSING STRUCTURE AND MEMORY

(71) Applicant: CHANGXIN MEMORY TECHNOLOGIES, INC., Hefei (CN)

(72) Inventor: Runjin Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 173 days.

(21) Appl. No.: 18/154,885

(22) Filed: Jan. 16, 2023

(65) Prior Publication Data

US 2024/0055069 A1 Feb. 15, 2024

Related U.S. Application Data

(63) Continuation of application No. PCT/CN2022/112496, filed on Aug. 15, 2022.

(30) Foreign Application Priority Data

Aug. 9, 2022 (CN) .......................... 202210947965.6

(51) Int. Cl.
  *G11C 29/52* (2006.01)
  *G11C 29/02* (2006.01)
(52) U.S. Cl.
  CPC ............ *G11C 29/52* (2013.01); *G11C 29/022* (2013.01); *G06F 2212/40* (2013.01)
(58) Field of Classification Search
  CPC .... G11C 29/52; G11C 29/022; G06F 2212/40
  See application file for complete search history.

(56) References Cited

U.S. PATENT DOCUMENTS

| 10,396,822 B2 * | 8/2019 | Myung ............... H03M 13/036 |
| 2002/0083247 A1 * | 6/2002 | Shah .................. G06F 13/1626 710/112 |

(Continued)

FOREIGN PATENT DOCUMENTS

| CN | 106201764 A | 12/2016 |
| CN | 107590019 A | 1/2018 |

(Continued)

OTHER PUBLICATIONS

ISA State Intellectual Property Office of the People's Republic of China, International Search Report Issued in Application No. PCT/CN2022/112496, Apr. 12, 2023 WIPO, 3 pages.

*Primary Examiner* — Samir W Rizk
(74) *Attorney, Agent, or Firm* — Kilpatrick Townsend & Stockton LLP

(57) ABSTRACT

Embodiments relate to the field of semiconductor circuit design, and more particularly, to a data processing method, a data processing structure, and a memory. The data processing method includes: obtaining raw data to be stored, and grouping the raw data to obtain first split data, the first split data having equal number of code elements; encoding each of the first split data to generate first encoded data, where the first encoded data includes the first split data and check data corresponding to the first split data; reorganizing the first encoded data to generate write data; storing the write data into a memory cell; and obtaining read data in the memory cell, and decoding and checking the read data to generate corrected read data, to correct a multi-bit burst error occurring in the memory during data storage or data transmission.

14 Claims, 4 Drawing Sheets

(56) References Cited

U.S. PATENT DOCUMENTS

| | | | | |
|---|---|---|---|---|
| 2011/0103400 A1* | 5/2011 | Wezelenburg | .... | H03M 13/6502 |
| | | | | 370/474 |
| 2011/0131464 A1* | 6/2011 | Ko | ....... | H04B 7/0413 |
| | | | | 714/752 |
| 2012/0192028 A1* | 7/2012 | Allpress | ............ | H03M 13/3972 |
| | | | | 714/752 |
| 2016/0266832 A1* | 9/2016 | Gaur | ........................ | G06F 3/067 |
| 2018/0189140 A1* | 7/2018 | Motwani | .............. | H03M 13/116 |
| 2019/0065776 A1* | 2/2019 | Jho | ........................ | G06F 21/606 |
| 2020/0133771 A1 | 4/2020 | Goyal et al. | | |
| 2020/0169731 A1* | 5/2020 | Xu | ........................ | H04N 19/105 |
| 2020/0272339 A1* | 8/2020 | Oberg | ................ | G11B 20/1809 |
| 2023/0080223 A1* | 3/2023 | Cismas | ................ | H04N 19/186 |
| | | | | 375/240.27 |

FOREIGN PATENT DOCUMENTS

| | | |
|---|---|---|
| CN | 111294059 A | 6/2020 |
| CN | 108733504 B | 8/2021 |
| CN | 113300840 A | 8/2021 |
| CN | 114691414 A | 7/2022 |
| TW | I503829 B | 10/2015 |

\* cited by examiner

DATA PROCESSING METHOD, DATA PROCESSING STRUCTURE AND MEMORY

CROSS-REFERENCE TO RELATED APPLICATION

The present disclosure is a continuation of PCT/CN2022/112496, filed on Aug. 15, 2022, which claims priority to Chinese Patent Application No. 202210947965.6 titled "DATA PROCESSING METHOD, DATA PROCESSING STRUCTURE AND MEMORY" and filed on Aug. 9, 2022, the entire contents of which are incorporated herein by reference.

TECHNICAL FIELD

The present disclosure relates to the field of semiconductor circuit design, and more particularly, to a data processing method, a data processing structure and a memory.

BACKGROUND

A dynamic random access memory (DRAM) is widely used in modern electronic systems because of its characteristics such as high storage density and fast transmission speed. With the development of semiconductor technologies, DRAM technologies are more and more advanced, and an integration level of memory cells is getting higher and higher. Meanwhile, various different applications are increasingly demanding for performance, power consumption, reliability and the like of the DRAM.

An existing memory with a channel error detecting and correcting function can only detect and repair 1-bit data errors, which cannot guarantee the accuracy of the memory in a process of data transmission. Therefore, it is urgent to design a data processing method and data processing structure that can detect and repair multi-bit data errors, to further improve the comprehensive performance of the memory.

SUMMARY

An embodiment of the present disclosure provides a data processing method, comprising: obtaining raw data to be stored, and grouping the raw data to obtain a plurality of first split data, where each of the plurality of first split data has equal number of code elements; encoding each of the plurality of first split data to generate first encoded data, where the first encoded data comprise each of the plurality of first split data and check data corresponding to each of the plurality of first split data; reorganizing the first encoded data to generate write data; storing the write data into a memory cell; and obtaining read data in the memory cell, and decoding and checking the read data to generate corrected read data.

Another embodiment of the present disclosure provides a data processing structure, which adopts the data processing method provided by the above embodiments. The data processing structure comprises: a data splitting circuit configured to obtain raw data and group the raw data to obtain first split data; a data encoding circuit connected to the data splitting circuit, the data encoding circuit being configured to encode the first split data to generate first encoded data, where the first encoded data comprise the first split data and check data corresponding to the first split data; a data integration circuit connected to the data encoding circuit and a memory cell, the data integration circuit being configured to reorganize the first encoded data to generate write data and write the write data into the memory cell; and a data recovery circuit connected to the memory cell, the data recovery circuit being configured to obtain read data of the memory cell, and decode and check the read data to generate corrected read data.

Still another embodiment of the present disclosure also provides a memory, which is configured to perform data processing on raw data to be stored in a memory cell based on the data processing method provided by the above embodiments.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As can be seen from the background art, generally an existing memory with a channel error correcting code only can detect and repair 1bit data errors, which cannot guarantee accuracy of the memory during data transmission.

An embodiment of the present disclosure provides a data processing method, to correct multi-bit burst errors occurring in the memory during data storage or data transmission.

A person of ordinary skill in the art may understand that in the embodiments of the present disclosure, many technical details are put forward such that a reader can better understand the present disclosure. However, the technical solutions requested to be protected by the present disclosure may also be implemented even without these technical details or various variations and modifications based on the following embodiments. Following divisions of the embodiments are for convenience of description and should not impose any limit on the embodiments of the present disclosure, and the embodiments may be combined with each other and referred to each other on a non-conflict basis.

Figure 1:
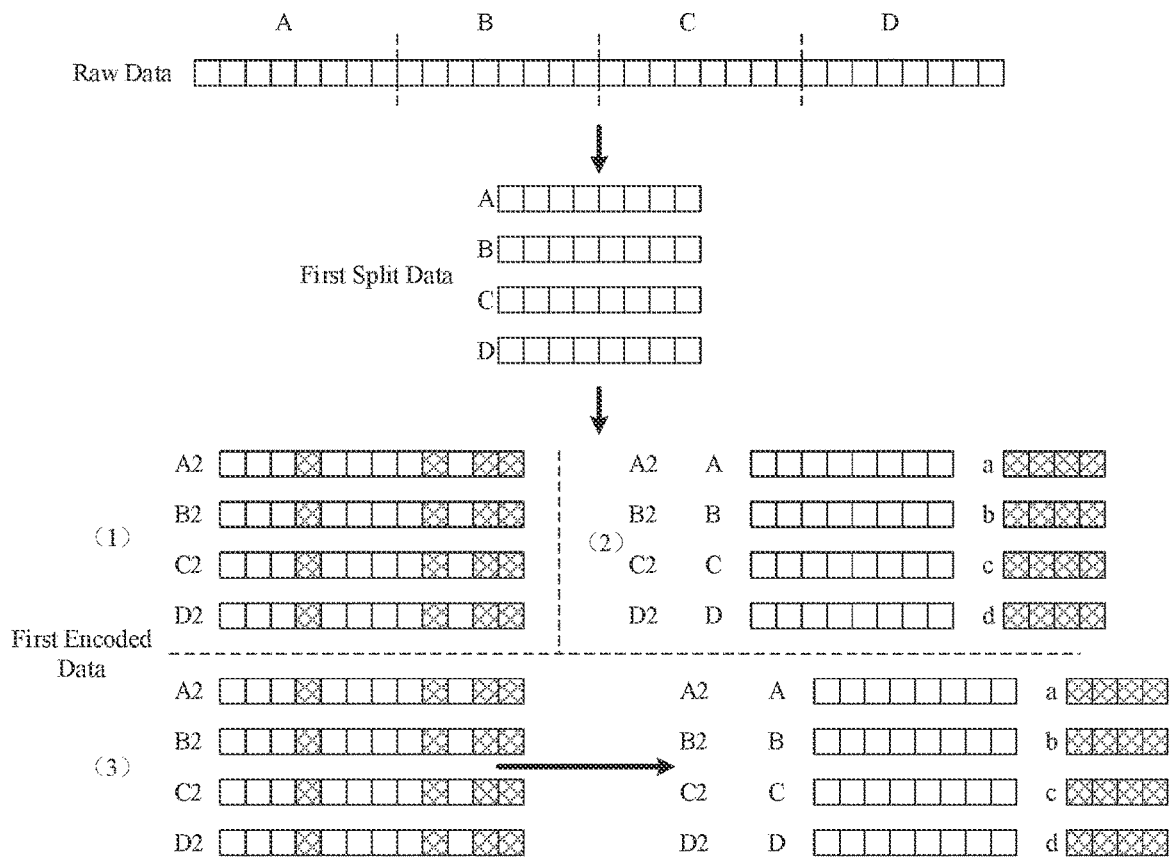
FIG. 1 is a schematic principle diagram of obtaining first split data by grouping and obtaining first encoded data by encoding in a data processing method according to an embodiment of the present disclosure.
Figure 6:
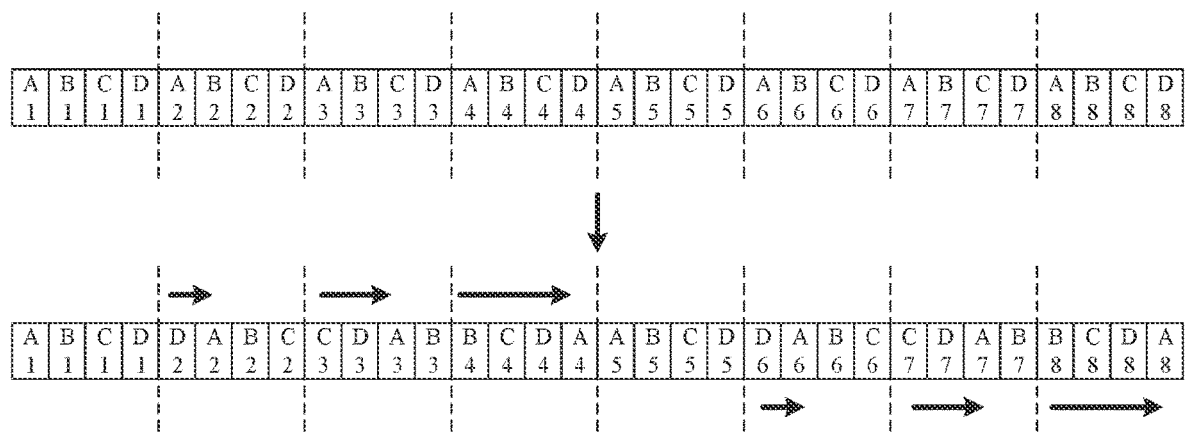
FIG. 6 is a schematic principle diagram of shifting to obtain write data according to an embodiment of the present disclosure.
Figure 7:
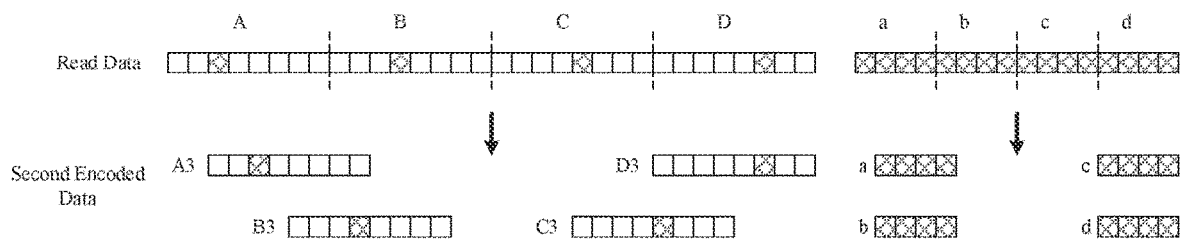
FIG. 7 is a schematic diagram of a data read principle corresponding to first write data in FIG. 4 or FIG. 5.
Figure 8:
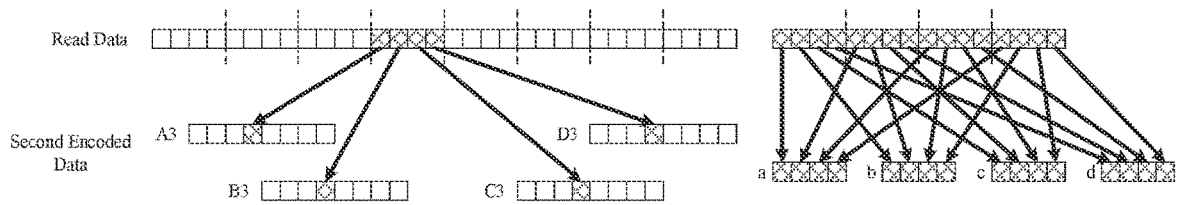
FIG. 8 is a schematic diagram of a data read principle corresponding to first write data in FIG. 6.
Figure 9:
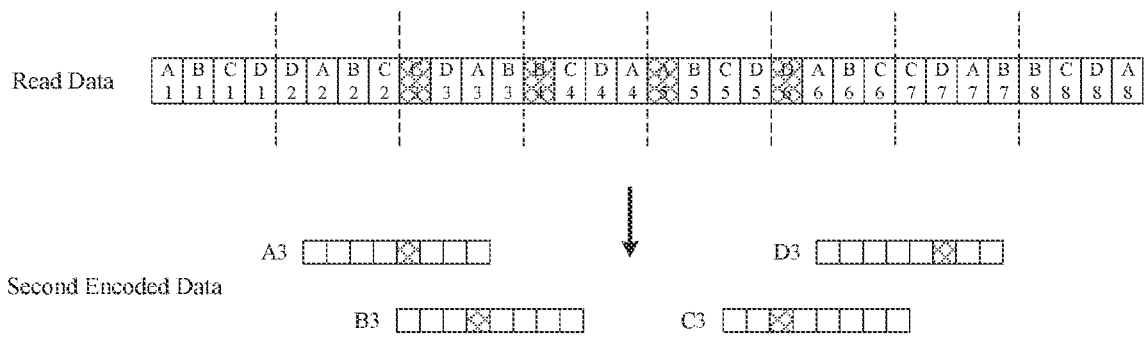
FIG. 9 is a schematic diagram of a data read principle corresponding to first write data in FIG. 7.

FIG. 1 is a schematic principle diagram of obtaining first split data by grouping and obtaining first encoded data by encoding in the data processing method according to this embodiment of the present disclosure; FIGS. 2 to 5 are schematic principle diagrams of reorganizing to obtain write data according to this embodiment of the present disclosure; FIG. 6 is a schematic principle diagram of shifting to obtain write data according to this embodiment of the present disclosure; FIG. 7 is a schematic diagram of a data read principle corresponding to first write data in FIG. 4 or FIG. 5; FIG. 8 is a schematic diagram of a data read principle corresponding to first write data in FIG. 6; and FIG. 9 is a schematic diagram of a data read principle corresponding to first write data in FIG. 7. A data access and check method provided in this embodiment will be described in detail below with reference to the accompanying drawings.

Referring to FIGS. 1 to 9, the data processing method includes following steps.

Referring to FIG. 1, Step S1: obtaining raw data to be stored, and grouping the raw data to obtain a plurality of first split data, where each of the plurality of first split data has equal number of code elements.

In some embodiments, the grouping the raw data to obtain the plurality of first split data comprises: grouping the raw data based on a same code element interval to obtain the plurality of first split data.

In an example illustrated in this embodiment, the raw data provided are 32-bit binary data. That is, the raw data include 32-bit code elements. In addition, in this embodiment, the raw data are grouped in such a way that the raw data are divided, with 8-bit interval code elements as a group, into four first split data, which are 8-bit split data A, 8-bit split data B, 8-bit split data C, and 8-bit split data D respectively. It should be noted that, number of code elements of the raw data and the grouping method of the raw data mentioned above do not limit this embodiment. In other embodiments, the raw data may be binary data of any code element. That is, the data processing method provided in this embodiment is applicable to the raw data of any number of code elements. In addition, in other embodiments, for the grouping of the raw data, the raw data may also be divided with 4-bit, 12-bit, 16-bit and other code element intervals as a group. It should also be noted that, the number of the first split data obtained by grouping the raw data determines the number of error code elements checking and correcting the raw data in the data processing method provided in this embodiment. In a concrete application, obtaining more first split data by splitting based on the raw data may correct more code elements of the raw data, thereby further ensuring the accuracy of the memory during data transmission and storage.

With continued reference to FIG. 1, Step S2: encoding each of the plurality of first split data to generate first encoded data, where the first encoded data comprise each of the plurality of first split data and check data corresponding to each of the plurality of first split data.

In some embodiments, the check data are configured to subsequently detect and correct corresponding data read from the memory cell. In some embodiments, the check data may be obtained by means of an error correcting code (ECC) circuit of the memory. Hamming code is a code check method widely used in memory error correction. It should be noted that, this embodiment describes in detail the data processing method provided in this embodiment by taking an example where the first split data are encoded in a Hamming code-based check mode to obtain the check data, which does not limit this embodiment. In other embodiments, the data processing method provided in this embodiment is also applicable to a memory which performs error detection and correction in other modes.

This embodiment provides three modes of generating the first encoded data as follows.

(1) In some embodiments, the generated check data corresponding to the first split data are inserted into the corresponding first split data to form integrated first encoded data A2, B2, C2, and D2. In subsequent operations, data reorganization may be performed directly based on the integrated first encoded data A2, B2, C2, and D2.

(2) In some embodiments, the generated check data corresponding to the first split data are independent of the first split data. That is, the first encoded data A2 include first split data A and check data a corresponding to the first split data A, the first encoded data B2 include first split data B and check data b corresponding to the first split data B, the first encoded data C2 include first split data C and check data c corresponding to the first split data C, and the first encoded data D2 include first split data D and check data d corresponding to the first split data D. In subsequent operations, the data reorganization may be performed based on the independent first split data A, B, C and D and the independent check data a, b, c and d, respectively.

(3) In some embodiments, if the generated check data are inserted into the corresponding first split data, before reorganizing the first encoded data to generate the write data, the data processing method further includes: adjusting the first split data to generate the independent first split data and check data. That is, if the generated first encoded data are of a data type shown in mode (1), in this example, the first split data also need to be split to obtain the check data independent of the first split data, such that the first encoded data are adjusted from the data type shown in mode (1) to the data type shown in mode (2).

It should be noted that, in other embodiments, if the generated check data are independent of the first split data, before the first encoded data are reorganized to generate the write data, the data processing method further includes: adjusting the first split data, to insert the check data into the first split data. That is, if the generated first encoded data are of the data type shown in mode (2), in this example, the check data also need to be inserted into the first split data, such that the first encoded data are adjusted from the data type shown in mode (2) to the data type shown in mode (1).

For the check data of Hamming code, if the check data are inserted into the corresponding first split data, a $d^{th}$ code element of the check data is inserted into a $2^{dth}$ code element position of the first split data. In some embodiments, the first code element of the check data is inserted into the first code element position of the first split data, the second code element of the check data is inserted into the second code element position of the first split data, the third code element of the check data is inserted into the fourth code element position of the first split data, and the fourth code element of the check data is inserted into the eighth code element position of the first split data.

It should be noted that, in the drawings provided in this embodiment, the check data generated by 8-bit first split data are 4-bit data, which does not limit this embodiment, and is only used by those skilled in the art to understand the data processing method provided in this embodiment. In a concrete application setting, a code element quantity e of the first split data checked by d-bit check data should be less than or equal to $2^d-1$-d.

Referring to FIGS. 2 to 5, Step S3: reorganizing the first encoded data to generate write data.

In some embodiments, the first split data are reorganized to generate first write data, the second split data are reorganized to generate second write data, and the write data are generated based on the first write data and the second write data.

Figure 2:
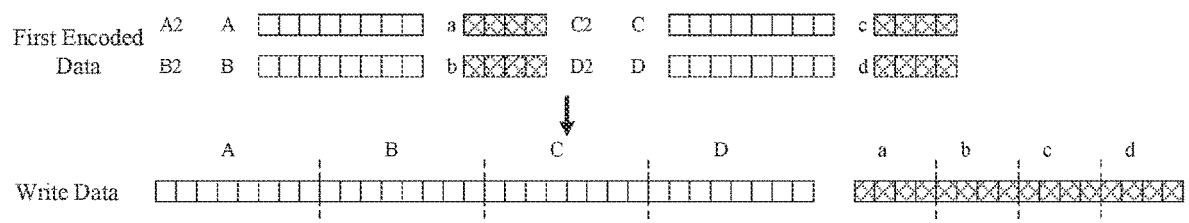
FIGS. 2 to 5 are schematic principle diagrams of reorganizing to obtain write data according to an embodiment of the present disclosure.

In one example, referring to FIG. 2, the first split data are connected end to end to generate the first write data. The second split data are connected end to end to generate the second write data.

Figure 3:
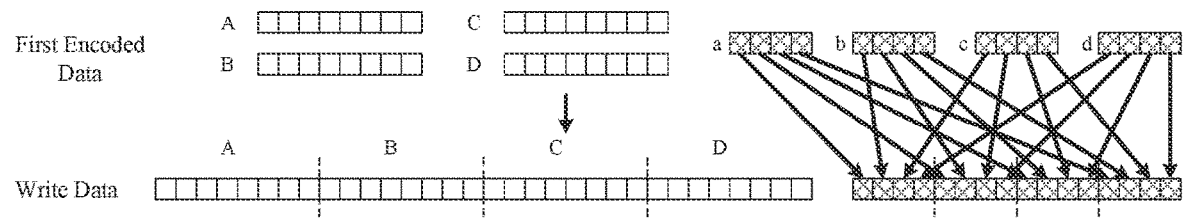

In one example, referring to FIG. 3, the first split data are connected end to end to generate the first write data. The reorganizing the check data to generate the second write data comprises: number of the check data generated on a basis of encoding the plurality of first split data being a, and number of code elements in each of the check data being c; reorganizing a $p^{th}$ code element of each of the check data to generate a $p^{th}$ check subdata, sequentially reorganizing a first check subdata to a $q^{th}$ check subdata, and organizing all the check subdata into the second write data; where both the a and the c are positive integers greater than 0, the q is equal to the c, the p is an arbitrary integer greater than or equal to 1 and less than or equal to the q, and number of the code elements in the check subdata is a.

In some embodiments, the first code element of each check data is sequentially written into the first check subdata, the second code element of each check data is sequentially written into the second check subdata, the third code element of each check data is sequentially written into the third check subdata, and the fourth code element of each check data is sequentially written into the fourth check subdata. Next, the first check subdata, the second check subdata, the third check subdata and the fourth check subdata constitute the second write data.

Figure 4:
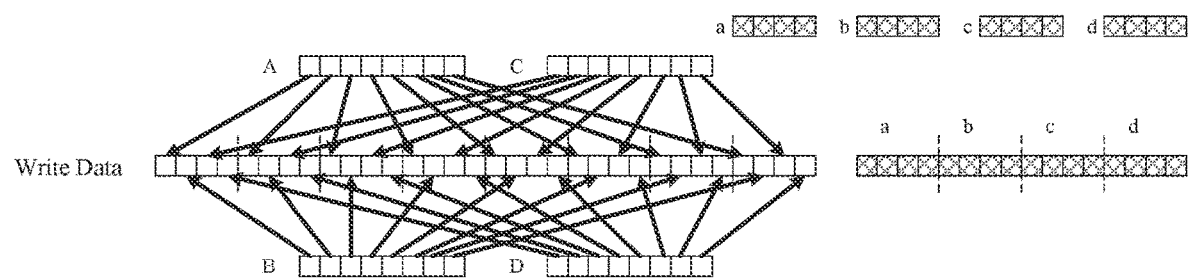

In one example, referring to FIG. 4, the reorganizing the plurality of first split data to generate the first write data comprises: number of the plurality of first split data obtained by splitting the raw data being a, and number of the code elements in each of the plurality of first split data being b; reorganizing an $x^{th}$ code element of each of the plurality of first split data to generate an $x^{th}$ write subdata, sequentially reorganizing a first write subdata to a $y^{th}$ write subdata, and organizing all the write subdata into the first write data; where both the a and the b are positive integers greater than 0, the y is equal to the b, the x is an arbitrary integer greater than or equal to 1 and less than or equal to the y, and number of the code elements of the write subdata is a. The second split data are connected end to end to generate the second write data.

In some embodiments, the first code element of each first split data is sequentially written into the first write subdata, the second code element of each first split data is sequentially written into the second write subdata . . . and the eighth code element of each first split data is sequentially written into the eighth write subdata. Next, the first write subdata, the second write subdata . . . and the eighth write subdata constitute the second write data.

Figure 5:
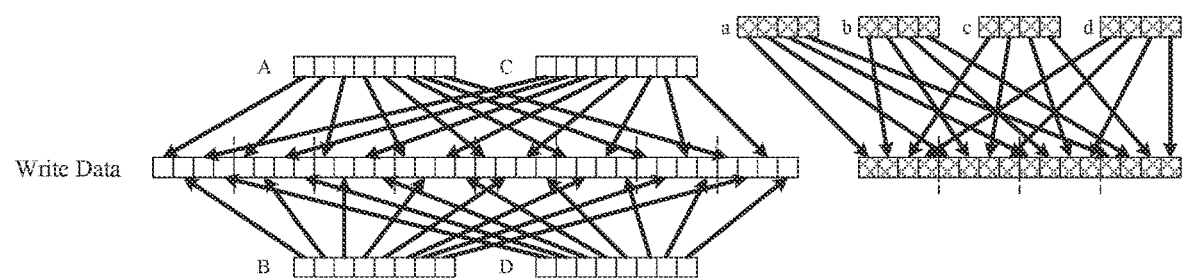

In one example, referring to FIG. 5, the reorganizing the plurality of first split data to generate the first write data comprises: number of the plurality of first split data obtained by splitting the raw data being a, and number of the code elements in each of the plurality of first split data being b; reorganizing an $x^{th}$ code element of each of the plurality of first split data to generate an $x^{th}$ write subdata, sequentially reorganizing the first write subdata to a $y^{th}$ write subdata, and organizing all the write subdata into the first write data; where both the a and the b are positive integers greater than 0, the y is equal to the b, the x is an arbitrary integer greater than or equal to 1 and less than or equal to the y, and number of the code elements of the write subdata is a. The reorganizing the check data to generate the second write data comprises: number of the check data generated on a basis of encoding the plurality of first split data being a, and number of code elements in each of the check data being c; reorganizing a $p^{th}$ code element of each of the check data to generate a $p^{th}$ check subdata, sequentially reorganizing a first check subdata to a $q^{th}$ check subdata, and organizing all the check subdata into the second write data; where both the a and the c are positive integers greater than 0, the q is equal to the c, the p is an arbitrary integer greater than or equal to 1 and less than or equal to the q, and number of the code elements in the check subdata is a.

In some embodiments, the first code element of each first split data is sequentially written into the first write subdata, the second code element of each first split data is sequentially written into the second write subdata . . . and the eighth code element of each first split data is sequentially written into the eighth write subdata. Next, the first write subdata, the second write subdata . . . and the eighth write subdata constitute the second write data. The first code element of each check data is sequentially written into the first check subdata, the second code element of each check data is sequentially written into the second check subdata, the third code element of each check data is sequentially written into the third check subdata, and the fourth code element of each check data is sequentially written into the fourth check subdata. Next, the first check subdata, the second check subdata, the third check subdata and the fourth check subdata constitute the second write data.

It should be noted that, if the check data in the first encoded data are split into the first split data, it is also applicable to the reorganization mode shown in FIG. 2 to FIG. 5, which is not described again in this embodiment.

In some embodiments, the reorganizing the plurality of first split data to generate the first write data further comprises: shifting a code element of a $z^{th}$ write subdata according to a preset rule, where the z is an arbitrary integer greater than or equal to 2 and less than or equal to the y. In some embodiments, code elements of write subdata other than the first write subdata are shifted.

In some embodiments, referring to FIG. 6, the shifting the code element of the $z^{th}$ write subdata according to the preset rule comprises: shifting the code element of the $z^{th}$ write subdata by z−1 bits. That is, the code element of the second write subdata is shifted by 1 bit, the code element of the third write subdata is shifted by 2 bits, the code element of the fourth write subdata is shifted by 3 bits, and the code element of the fifth write subdata is shifted by 4 bits. Because the fifth write subdata only include 4-bit data, the data after shifting are the same as the data before shifting. The code element of the sixth write subdata is shifted by 5 bits. Because the sixth write subdata only include 4-bit data, shift of the code element of 1 bit still exists in the data after shifting and the data before shifting. The code element of the seventh write subdata is shifted by 6 bits. Because the seventh write subdata only include 4-bit data, shift of the code element of 2 bits still exists in the data after shifting and the data before shifting. The code element of the eighth write subdata is shifted by 7 bits. Because the eighth write subdata only include 4-bit data, shift of the code element of 3 bits still exists in the data after shifting and the data before shifting.

It should be noted that, serial numbers shown in FIG. 6 are configured for representing the serial numbers of the code elements in the first split data. For example, "A5" represents the fifth code element of the first split data A, and "C7" represents the seventh code element of the first split data C. Those skilled in the art may deduce meanings of other serial numbers based on the above discussion, which is not described again in this embodiment.

In some embodiments, the shifting the code element of the $z^{th}$ write subdata according to the preset rule comprises: shifting the code element of the $z^{th}$ write subdata by s bits, where the s is generated based on a shift random number, and the shift random numbers corresponding to different $z^{th}$ write subdata are different.

In some embodiments, referring to FIG. 6, the shifting the code element of the $z^{th}$ write subdata according to the preset rule comprises: shifting the code element of the $z^{th}$ write subdata by a preset bit.

It should be noted that, in the introduction of the above embodiment, the first write subdata, the second write subdata . . . and the eighth write subdata are formed first, and then the code elements of the first write subdata, the second write subdata . . . and the eighth write subdata are shifted. In some embodiments, shifted first write subdata, second write subdata . . . and eighth write subdata may be directly generated based on a shifted reorganization mode. It should also be noted that, only the shift of the first write data is embodied in this embodiment. In some embodiments, the shift of the second write data may also be implemented based on the shifting mode described above, which is not described again in this embodiment.

It should also be noted that, in the above example, the first split data are split and then shifted to generate the write data. In some embodiments, the process of data reorganization and data shift may also be implemented in the same step. That is, the shift of the code elements is implemented in the process of data reorganization. As long as the method steps of data reorganization and data shift are met in the process of data storage and check, regardless of execution sequence of the steps, the data should fall within the scope of protection of the present disclosure.

Step S4: storing the write data into a memory cell.

In some embodiments, in the process of storing the write data into a memory cell, the first write data and the second write data are merged and written into corresponding memory cells. In some embodiments, the first write data and the second write data are written into the corresponding memory cells, respectively. The first write data and the second write data are separately stored, which can prevent, to a certain extent, occurrence of errors beyond error correction capability.

Step S5: obtaining read data in the memory cell, and decoding and checking the read data to generate corrected read data.

In some embodiments, Step S5 includes Step S5-1: splitting, based on a reorganization mode where the write data are generated from the first encoded data, the read data to generate second encoded data, where the second encoded data comprise second split data corresponding to each of the plurality of first split data and the check data.

In one example, referring to FIG. 7, if there are four burst errors in the read data and each of the four burst error is in different split fields, the read data are split to generate the second encoded data, such that the four burst errors are split into the second split data A3, B3, C3 and D3, respectively. The split second split data A3, B3, C3 and D3 each include one burst error, and data correction may be implemented based on decoding of the second encoded data in subsequent error detection and correction.

By splitting and encoding the raw data, and reorganizing and writing the encoded split data into the memory cell, the error detection and correction of one data are converted into the error detection and correction of a plurality of data compared with directly encoding and storing the raw data into the memory cell. The check data corresponding to the first split data are configured for checking and correcting 1-bit data errors in the first split data. For the reorganized write data, the error detection and correction of data errors with the same number of bits as the first split data may be completed to ensure the accuracy of the memory in the process of data transmission.

In one example, referring to FIG. 8, if there are four consecutive burst errors in the read data, because reorganizing the first encoded data to form the write data is in-situ reorganization (referring to FIG. 4 or FIG. 5), in the process of splitting the read data to generate the second encoded data, each code element is reorganized into the second split data based on the in-situ reorganization, such that the consecutive burst errors are split into the second split data A3, B3, C3 and D3. The split second split data A3, B3, C3 and D3 each include one burst error. In the subsequent error detection and correction, data correction may be implemented based on decoding of the second encoded data.

By performing the in-situ reorganization on the first split data, if the consecutive burst errors occur in the process of reading the write data, the error data may be distributed to different split data for decoding, checking and correcting, to avoid occurrence of consecutive multi-bit errors in the memory that cannot be detected and corrected by existing encoding and decoding methods, thereby ensuring the accuracy of the memory during data transmission and storage.

In one example, referring to FIG. 9, if a plurality of burst errors with an equal spacing appear in the read data, based on the shift reorganization mode shown in FIG. 6, in the process of splitting the read data to form second encoded data, the error code elements may be distributed to the third code element of the second split data C3, the fourth code element of the second split data B3, the fifth code element of the second split data A3 and the sixth code element of the second split data D3, such that the split second split data A3, B3, C3 and D3 each include one burst error, and data correction may be implemented based on decoding of the second encoded data in the subsequent error detection and correction.

In the process of forming the first write data, the code element is shifted for the write subdata. If the multi-bit burst errors with an equal spacing occur, the wrong data may be distributed to different split data for decoding, checking and correcting, to avoid occurrence of the multi-bit errors with the equal spacing in the memory, thereby ensuring the accuracy of the memory during data transmission and storage.

For the check data, in one example, referring to FIG. 7, if the check data are connected end to end to form the second write data, in the process of obtaining the second encoded data from the read data, the second write data are directly split to obtain the check data corresponding to the second split data. In one example, referring to FIG. 8, if the check data are formed into the second write data based on the in-situ reorganization, in the process of obtaining the second encoded data from the read data, the second write data are reorganized, based on the mode where the second write data are formed by means of the in-situ reorganization, to generate the check data corresponding to the second split data.

It should be noted that, the error code elements in FIG. 7 to FIG. 9 are embodied in the process of obtaining the read data from the memory cells. In a concrete application, the error code elements may also occur in the process of data transmission, and concrete timing of the occurrence of the error code elements is not limited in this embodiment.

Step S5-2: decoding the second encoded data to check and correct the second split data to obtain corrected data, where the corrected data are the same as each of the plurality of first split data corresponding to the second split data.

Step S5-3: organizing, based on a grouping mode where the plurality of first split data are generated from the raw data, the corrected data to obtain the corrected read data, where the corrected read data are the same as the raw data.

In conclusion, in this embodiment, by splitting and encoding the raw data and reorganizing and writing the encoded split data into the memory cell, the error detection and correction of one data are converted into the error detection and correction of a plurality of data compared with directly encoding and storing the raw data into the memory cell. The check data corresponding to the first split data are configured for checking and correcting 1-bit data errors in the first split data. For the reorganized write data, the error detection and correction of data errors with the same number of bits as the first split data may be completed to ensure the accuracy of the memory in the process of data transmission. In addition, by performing the in-situ reorganization on the first split data, if the consecutive burst errors occur in the process of reading the write data, the error data may be distributed to different split data for decoding, checking and correcting, to avoid occurrence of consecutive multi-bit errors in the memory that cannot be detected and corrected by existing encoding and decoding methods, thereby ensuring the accuracy of the memory during data transmission and storage. In the process of forming the first write data, the code element is shifted for the write subdata. If the multi-bit burst errors with an equal spacing occur, the wrong data may be distributed to different split data for decoding, checking and correcting, to avoid occurrence of the multi-bit errors with the equal spacing in the memory, thereby ensuring the accuracy of the memory during data transmission and storage.

It should be noted that the features disclosed in the data processing method provided by the above embodiments can be arbitrarily combined on a non-conflict basis, and new data processing method embodiment can be obtained.

Another embodiment of the present disclosure provides a data processing structure, which adopts the data processing method provided by the above embodiments to correct the multi-bit burst errors occurring in the memory during data storage or data transmission.

Figure 10:
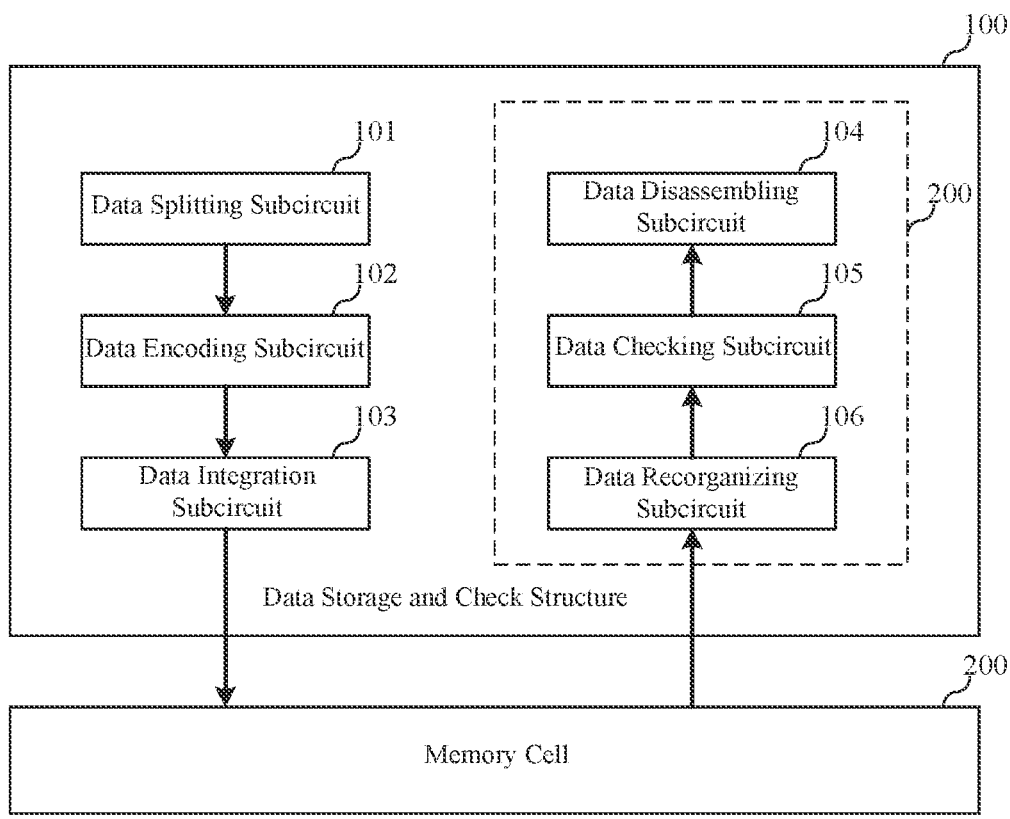
FIG. 10 is a schematic structural diagram of a data processing structure according to another embodiment of the present disclosure.

FIG. 10 is a schematic structural diagram of a data processing structure according to an embodiment of the present disclosure. The data processing structure provided by this embodiment is described in detail below with reference to the accompanying drawings.

Referring to FIG. 10, a data processing structure 100 includes: a data splitting circuit 101 configured to obtain raw data and group the raw data to obtain first split data; a data encoding circuit 102 connected to the data splitting circuit 101, the data encoding circuit 102 being configured to encode the first split data to generate first encoded data, where the first encoded data comprise the first split data and check data corresponding to the first split data; a data integration circuit 103 connected to the data encoding circuit 102 and a memory cell 200, where the data integration circuit 103 is configured to reorganize the first encoded data to generate write data and write the write data into the memory cell 200; and a data recovery circuit 200 connected to the memory cell 200, where the data recovery circuit 200 is configured to obtain read data of the memory cell 200, and decode and check the read data to generate corrected read data.

After the raw data are split by the data splitting circuit 101, the split data are encoded by the data encoding circuit 102, and the encoded split data are reorganized and written into the memory cell 200 by the data integration circuit 103. Compared with directly encoding and storing the raw data into the memory cell 200, the error detection and correction of one data are converted into the error detection and correction of a plurality of data. The check data corresponding to the first split data are configured for checking and correcting 1-bit data errors in the first split data. For the reorganized write data, the error detection and correction of data errors with the same number of bits as the first split data may be completed to ensure the accuracy of the memory in the process of data transmission.

With continued reference to FIG. 10, in some embodiments, the data recovery circuit 200 includes: a data disassembling subcircuit 104 connected to the memory cell 200, the data disassembling subcircuit 104 being configured to obtain the read data from the memory cell 200, and split the read data based on a data reorganization mode of the data integration circuit 103 to generate second encoded data, where the second encoded data comprise second split data corresponding to the first split data and the check data; a data checking subcircuit 105 connected to the data disassembling subcircuit 104, the data checking subcircuit 105 being configured to decode the second encoded data to check and correct the second split data to obtain corrected data, where the corrected data are the same as the first split data corresponding to the second split data; and a data reorganizing subcircuit 106 connected to the data checking subcircuit 105, the data reorganizing subcircuit 106 being configured to organize, based on a grouping mode of the data splitting circuit 101, the corrected data to obtain the corrected read data, where the corrected read data are the same as the raw data.

For the data encoding circuit 102, in one example, the data encoding circuit 102 includes an encoding subunit connected to the data splitting circuit, where the encoding subunit is configured to encode the first split data to generate the check data corresponding to the first split data. In some embodiments, the data encoding circuit 102 further includes a splitting subunit connected to the encoding subunit, where the splitting subunit is configured to split such that the first split data are independent of the check data.

For the data integration circuit 103, in one example, the data integration circuit 103 includes: a first integration subunit connected to the data encoding circuit, where the first integration subunit is configured to reorganize an $x^{th}$ code element of each of the plurality of first split data, and integrate the first write subdata into the code element of the $y^{th}$ write subdata to generate the first write data; a second integration subunit connected to the data encoding circuit, where the second integration subunit is configured to reorganize a $p^{th}$ code element of each check data into the $p^{th}$ check subdata, and integrate the first check subdata into a code element of the $q^{th}$ check subdata to generate the second write data; a third integration subunit connected to the first integration subunit and the second integration subunit, where the third integration subunit is configured to generate the write data based on the first write data and the second write data; a transmission subcircuit connected to the third integration subunit and the memory cell, where the transmission subcircuit is configured to store the write data into the memory cell. The y is equal to the number of the code elements of the first split data, the x is an arbitrary integer greater than or equal to 1 and less than or equal to the y, the q is equal to the number of the code elements of the check data, and the p is an arbitrary integer greater than or equal to 1 and less than or equal to q.

In some embodiments, referring to FIG. 5, the first code element of each first split data is sequentially written into the first write subdata, the second code element of each first split data is sequentially written into the second write subdata . . . and the eighth code element of each first split data is sequentially written into the eighth write subdata. Next, the first write subdata, the second write subdata . . . and the eighth write subdata constitute the second write data. The first code element of each check data is sequentially written into the first check subdata, the second code element of each check data is sequentially written into the second check subdata, the third code element of each check data is sequentially written into the third check subdata, and the fourth code element of each check data is sequentially written into the fourth check subdata. Next, the first check subdata, the second check subdata, the third check subdata and the fourth check subdata constitute the second write data.

In this example, by performing in-situ reorganization on the first split data by means of the data integration circuit 103 and generating the write data based on the data after the in-situ reorganization, if the consecutive burst errors occur in the process of reading the write data, the error data may be distributed to different split data for decoding, checking and correcting, to avoid the occurrence of the consecutive multi-bit errors in the memory, thereby ensuring the accuracy of the memory during data transmission and storage.

In some embodiments, the data integration circuit 103 further includes: a shift subcircuit connecting the first integration subunit and configured to shift the code element of the $z^{th}$ write subdata, where the z is an arbitrary integer greater than or equal to 2 and less than or equal to q. The third integration subunit is configured to generate the write data according to the first write data and the second write data shifted. In this example, in the process of forming the first write data, the code element is shifted for the write subdata by means of the shift subcircuit. If the multi-bit burst errors with an equal spacing occur, the wrong data may be distributed to different split data for decoding, checking and correcting, to avoid the occurrence of the multi-bit errors with the equal spacing in the memory, thereby ensuring the accuracy of the memory during data transmission and storage.

In one example, the shifting the code element of the $z^{th}$ write subdata includes: shifting the code element in the $z^{th}$ write subdata by z−1 bits. In some embodiments, referring to FIG. 6, the code element of the second write subdata is shifted by 1 bit, the code element of the third write subdata is shifted by 2 bits, the code element of the fourth write subdata is shifted by 3 bits, and the code element of the fifth write subdata is shifted by 4 bits. Because the fifth write subdata only include 4-bit data, the data after shifting are the same as the data before shifting. The code element of the sixth write subdata is shifted by 5 bits. Because the sixth write subdata only include 4-bit data, shift of the code element of 1 bit still exists in the data after shifting and the data before shifting. The code element of the seventh write subdata is shifted by 6 bits. Because the seventh write subdata only include 4-bit data, shift of the code element of 2 bits still exists in the data after shifting and the data before shifting. The code element of the eighth write subdata is shifted by 7 bits. Because the eighth write subdata only include 4-bit data, shift of the code element of 3 bits still exists in the data after shifting and the data before shifting.

In one example, the shifting the code element of the $z^{th}$ write subdata comprises: shifting the code element of the $z^{th}$ write subdata by s bits, where the s is generated based on a shift random number, and the shift random numbers corresponding to different $z^{th}$ write subdata are different.

In one example, the shifting the code element of the $z^{th}$ write subdata includes: shifting the code element of the $z^{th}$ write subdata by a preset bit.

In conclusion, in this embodiment, after the raw data are split by the data splitting circuit 101, the split data are encoded by the data encoding circuit 102, and the encoded split data are reorganized and written into the memory cell 200 by the data integration circuit 103. Compared with directly encoding and storing the raw data into the memory cell 200, the error detection and correction of one data are converted into the error detection and correction of a plurality of data. The check data corresponding to the first split data are configured for checking and correcting 1-bit data errors in the first split data. For the reorganized write data, the error detection and correction of data errors with the same number of bits as the first split data may be completed to ensure the accuracy of the memory in the process of data transmission. In addition, by performing the in-situ reorganization on the first split data by means of the data integration circuit 103 and generating the write data based on the data obtained after the in-situ reorganization, if the consecutive burst errors occur in the process of reading the write data, the error data may be distributed to different split data for decoding, checking and correcting, to avoid the occurrence of the consecutive multi-bit errors in the memory, thereby ensuring the accuracy of the memory during data transmission and storage. In addition, in the process of forming the first write data, the code element is shifted for the write subdata by means of the shift subcircuit. If the multi-bit burst errors with an equal spacing occur, the wrong data may be distributed to different split data for decoding, checking and correcting, to avoid the occurrence of the multi-bit errors with the equal spacing in the memory, thereby ensuring the accuracy of the memory during data transmission and storage.

It should be noted that the features disclosed in the data processing structure provided by the above embodiments can be arbitrarily combined on a non-conflict basis, and new data processing structure embodiments can be obtained.

Still another embodiment of the present disclosure provide a memory. The memory is configured to check data of the memory cell and perform data processing on raw data to be stored in the memory cell based on the data processing method according to the above embodiments, to correct the multi-bit burst errors occurring in the memory during data storage or data transmission.

In some embodiments, the memory may be a memory cell or device based on a semiconductor device or component. For example, the memory device may be a volatile memory, such as dynamic random access memory (DRAM), synchronous dynamic random access memory (SDRAM), double data rate synchronous dynamic random access memory (DDR SDRAM), low power double data rate synchronous dynamic random access memory (LPDDR SDRAM), graphics double data rate synchronous dynamic random access memory (GDDR SDRAM), double data rate 2 synchronous dynamic random access memory (DDR2 SDRAM), double data rate 3 synchronous dynamic random access memory (DDR3 SDRAM), double data rate 4 synchronous dynamic random access memory (DDR4 SDRAM), an thyristor random access memory (TRAM), etc., or, the memory device may be may be a non-volatile memory, such as a phase change random access memory (PRAM), a magnetic random access memory (MRAM), a resistive random access memory (RRAM), and the like.

By splitting and encoding the raw data, and reorganizing and writing the encoded split data into the memory cell, the error detection and correction of one data are converted into the error detection and correction of a plurality of data compared with directly encoding and storing the raw data into the memory cell. The check data corresponding to the first split data are configured for checking and correcting 1-bit data errors in the first split data. For the reorganized write data, the error detection and correction of data errors with the same number of bits as the first split data may be completed to ensure the accuracy of the memory in the process of data transmission.

Furthermore, by performing the in-situ reorganization on the first split data, if the consecutive burst errors occur in the process of reading the write data, the error data may be distributed to different split data for decoding, checking and correcting, to avoid occurrence of consecutive multi-bit errors in the memory that cannot be detected and corrected by existing encoding and decoding methods, thereby ensuring the accuracy of the memory during data transmission and storage.

Furthermore, in the process of forming the first write data, the code element is shifted for the write subdata. If the multi-bit burst errors with an equal spacing occur, the wrong data may be distributed to different split data for decoding, checking and correcting, to avoid occurrence of the multi-bit errors with the equal spacing in the memory, thereby ensuring the accuracy of the memory during data transmission and storage.

Those of ordinary skill in the art can understand that the above-mentioned embodiments are some embodiments for realizing the present disclosure, but in practical applications, various changes may be made to them in form and details without departing from the spirit and scope of the present disclosure.

What is claimed is:

1. A data processing method, comprising:
   obtaining raw data to be stored, and grouping the raw data to obtain a plurality of first split data, each of the plurality of first split data having equal number of code elements;
   encoding each of the plurality of first split data to generate first encoded data, the first encoded data comprising each of the plurality of first split data and check data corresponding to each of the plurality of first split data;
   reorganizing the first encoded data to generate write data;
   storing the write data into a memory cell; and
   obtaining read data in the memory cell, and decoding and checking the read data to generate corrected read data; and, wherein
   reorganizing the first encoded data to generate the write data comprises:
   reorganizing the plurality of first split data to generate first write data, and reorganizing the check data to generate second write data; and
   generating the write data based on the first write data and the second write data;
   reorganizing the plurality of first split data to generate the first write data comprises:
   reorganizing an $x^{th}$ code element of each of the plurality of first split data to generate an $x^{th}$ write subdata, sequentially reorganizing a first write subdata to a $y^{th}$ write subdata, and organizing all the write subdata into the first write data, wherein
   a is number of the plurality of first split data obtained by splitting the raw data, and b is number of the code elements in each of the plurality of first split data; and
   both a and b are positive integers greater than 0, the y is equal to the b, the x is an arbitrary integer greater than or equal to 1 and less than or equal to the y, and number of the code elements of the write subdata is a; and
   reorganizing the plurality of first split data to generate the first write data further comprises: shifting a code element of a $z^{th}$ write subdata according to a preset rule, the z being an arbitrary integer greater than or equal to 2 and less than or equal to the y.

2. The data processing method according to claim 1, wherein the decoding and checking the read data to generate the corrected read data comprises:
   splitting, based on a reorganization mode where the write data are generated from the first encoded data, the read data to generate second encoded data, wherein the second encoded data comprise second split data corresponding to each of the plurality of first split data and the check data;
   decoding the second encoded data to check and correct the second split data to obtain corrected data, the corrected data being same as each of the plurality of first split data corresponding to the second split data; and
   organizing, based on a grouping mode where the plurality of first split data are generated from the raw data, the corrected data to obtain the corrected read data, wherein the corrected read data are same as the raw data.

3. The data processing method according to claim 1, wherein the reorganizing the check data to generate the second write data comprises: connecting the check data end to end to generate the second write data.

4. The data processing method according to claim 1, wherein the reorganizing the check data to generate the second write data comprises:
   number of the check data generated on a basis of encoding the plurality of first split data being a, and number of code elements in each of the check data being c;
   reorganizing a pth code element of each of the check data to generate a pth check subdata, sequentially reorganizing a first check subdata to a qth check subdata, and organizing all the check subdata into the second write data;
   wherein both the a and the c are positive integers greater than 0, the q is equal to the c, the p is an arbitrary integer greater than or equal to 1 and less than or equal to the q, and number of the code elements in the check subdata is a.

5. The data processing method according to claim 1, wherein
   the shifting the code element of the zth write subdata according to the preset rule comprises:
   shifting the code element of the zth write subdata by z–1 bits.

6. The data processing method according to claim 1, wherein the shifting the code element of the zth write subdata according to the preset rule comprises: shifting the code element of the zth write subdata by s bits, wherein the s is generated based on a shift random number, and the shift random numbers corresponding to different zth write subdata are different.

7. The data processing method according to claim 1, wherein the shifting the code element of the zth write subdata according to the preset rule comprises: shifting the code element of the zth write subdata by a preset bit.

8. The data processing method according to claim 1, wherein the grouping the raw data to obtain the plurality of first split data comprises: grouping the raw data based on a same code element interval to obtain the plurality of first split data.

9. The data processing method according to claim 1, wherein the encoding each of the plurality of first split data to generate the first encoded data comprises: inserting the generated check data corresponding to each of the plurality of first split data into a corresponding one of the plurality of first split data, or allowing the generated check data corresponding to the plurality of first split data to be independent of the plurality of first split data.

10. The data processing method according to claim 9, further comprising:
encoding the plurality of first split data based on a Hamming code check mode to obtain the check data;
wherein the inserting the generated check data into the corresponding one of the plurality of first split data comprises: inserting a dth code element of the check data into a 2dth code element of the plurality of first split data.

11. The data processing method according to claim 9, wherein when the check data generated is inserted into the corresponding one of the plurality of first split data, before reorganizing the first encoded data to generate the write data, the data processing method further comprises: adjusting the plurality of first split data to generate the plurality of first split data and the check data independent of each other.

12. A data processing structure adopting the data processing method according to claim 1, comprising:
a data splitting circuit configured to obtain raw data and group the raw data to obtain first split data;
a data encoding circuit connected to the data splitting circuit, the data encoding circuit being configured to encode the first split data to generate first encoded data, wherein the first encoded data comprise the first split data and check data corresponding to the first split data;
a data integration circuit connected to the data encoding circuit and a memory cell, the data integration circuit being configured to reorganize the first encoded data to generate write data and write the write data into the memory cell; and
a data recovery circuit connected to the memory cell, the data recovery circuit being configured to obtain read data of the memory cell, and decode and check the read data to generate corrected read data.

13. The data processing structure according to claim 12, wherein the data recovery circuit comprises:
a data disassembling subcircuit connected to the memory cell, the data disassembling subcircuit being configured to obtain the read data from the memory cell, and split the read data based on a data reorganization mode of the data integration circuit to generate second encoded data, wherein the second encoded data comprise second split data corresponding to the first split data and the check data;
a data checking subcircuit connected to the data disassembling subcircuit, the data checking subcircuit being configured to decode the second encoded data to check and correct the second split data to obtain corrected data, wherein the corrected data are same as the first split data corresponding to the second split data; and
a data reorganizing subcircuit connected to the data checking subcircuit, the data reorganizing subcircuit being configured to organize, based on a grouping mode of the data splitting circuit, the corrected data to obtain the corrected read data, wherein the corrected read data are same as the raw data.

14. A memory configured to perform data processing on raw data to be stored in a memory cell based on the data processing method according to claim 1.

* * * * *